(12) United States Patent
Kang et al.

(10) Patent No.: US 9,305,686 B2
(45) Date of Patent: Apr. 5, 2016

(54) MULTILAYER CERAMIC ELECTRONIC COMPONENT AND MANUFACTURING METHOD THEREOF

(71) Applicant: SAMSUNG ELECTRO-MECHANICS CO., LTD., Suwon (KR)

(72) Inventors: Byung Sung Kang, Gyunggi-do (KR); Byung Kil Seo, Gyunggi-do (KR)

(73) Assignee: SAMSUNG ELECTRO-MECHANICS CO., LTD., Gyunggi-Do (KR)

( * ) Notice: Subject to any disclaimer, the term of this patent is extended or adjusted under 35 U.S.C. 154(b) by 255 days.

(21) Appl. No.: 13/633,508

(22) Filed: Oct. 2, 2012

(65) Prior Publication Data

US 2013/0082575 A1    Apr. 4, 2013

(30) Foreign Application Priority Data

Oct. 4, 2011    (KR) .................. 10-2011-0100773

(51) Int. Cl.
| | | |
|---|---|---|
| *H01F 5/00* | (2006.01) | |
| *H01C 7/10* | (2006.01) | |
| *H01G 4/008* | (2006.01) | |
| *H01L 41/43* | (2013.01) | |
| *H01L 41/047* | (2006.01) | |
| *H01L 41/083* | (2006.01) | |
| *H01L 41/293* | (2013.01) | |
| *H01L 41/297* | (2013.01) | |
| *H01C 7/00* | (2006.01) | |
| *H01F 17/00* | (2006.01) | |
| *H01F 27/29* | (2006.01) | |

(52) U.S. Cl.
CPC ............ *H01C 7/10* (2013.01); *H01C 7/008* (2013.01); *H01F 5/00* (2013.01); *H01G 4/008* (2013.01); *H01L 41/0471* (2013.01); *H01L 41/0472* (2013.01); *H01L 41/0478* (2013.01); *H01L 41/083* (2013.01); *H01L 41/293* (2013.01); *H01L 41/297* (2013.01); *H01L 41/43* (2013.01); *H01F 17/0006* (2013.01); *H01F 27/292* (2013.01); *Y10T 29/49155* (2015.01)

(58) Field of Classification Search
CPC ................... H01F 5/00; H01F 27/00–27/30
USPC ............... 336/65, 83, 200, 232, 206–208
See application file for complete search history.

(56) References Cited

FOREIGN PATENT DOCUMENTS

| | | | |
|---|---|---|---|
| EP | 1783790 A1 | * | 5/2007 |
| JP | 2001223132 A | * | 8/2001 |
| KR | 2005-0102767 A | | 10/2005 |
| KR | 2011-0047481 A | | 5/2011 |

* cited by examiner

*Primary Examiner* — Tuyen Nguyen
(74) *Attorney, Agent, or Firm* — McDermott Will & Emery LLP

(57) ABSTRACT

There are provided a multilayer ceramic electronic component that does not require a heat treatment under a reduction atmosphere, and a manufacturing method thereof, wherein a conductive oxide is used as a material of internal and external electrodes and conductive layers having elasticity are formed on the external electrodes. In the case of the multilayer ceramic electronic component, a firing process may be performed under an air atmosphere, such that a manufacturing process may be simplified and manufacturing costs may be reduced.

8 Claims, 1 Drawing Sheet

MULTILAYER CERAMIC ELECTRONIC COMPONENT AND MANUFACTURING METHOD THEREOF

CROSS-REFERENCE TO RELATED APPLICATIONS

This application claims the priority of Korean Patent Application No. 10-2011-0100773 filed on Oct. 4, 2011, in the Korean Intellectual Property Office, the disclosure of which is incorporated herein by reference.

BACKGROUND OF THE INVENTION

1. Field of the Invention

The present invention relates to a multilayer ceramic electronic component and a manufacturing method thereof, and more particularly, to a multilayer ceramic electronic component that does not require a heat treatment under a reduction atmosphere, and a manufacturing method thereof.

2. Description of the Related Art

Generally, electronic components using a ceramic material, such as a capacitor, an inductor, a piezoelectric element, a varistor, a thermistor, or the like, include a ceramic body formed of the ceramic material, internal electrodes formed within the ceramic body, and external electrodes mounted on surfaces of the ceramic body so as to be connected to the internal electrodes.

The internal electrodes are initially formed on a ceramic sheet through printing. As a material for the internal electrode, a noble metal such as palladium or silver may be used. However, in this case, manufacturing costs may increase.

In order to solve this problem, a base metal such as nickel, or the like, has been used. However, in the case in which the base metal is fired in the air, the internal electrode is oxidized.

In order to prevent the oxidization of the internal electrode, a firing atmosphere should be maintained as a reducing atmosphere, which may be burdensome in terms of technology and costs.

In addition, since mismatches may occur between a metal and a ceramic due to differences in sinterability and in thermal expansion coefficients between dielectric layers, a need exists for a precise heat treatment technology capable of minimizing the mismatching.

Further, when the metal and the ceramic are subjected to repeated thermal history, a defect such as a crack, or the like, may commonly be generated at an interface between the ceramic and the metal due to an essential difference in thermal expansion coefficient.

SUMMARY OF THE INVENTION

An aspect of the present invention provides a multilayer ceramic electronic component that does not require a heat treatment under a reduction atmosphere, and a manufacturing method thereof.

According to an aspect of the present invention, there is provided a multilayer ceramic electronic component including: a ceramic body; internal electrodes multilayered within the ceramic body and including a first conductive oxide; and external electrodes formed on outer surfaces of the ceramic body, connected to the internal electrodes, and including a second conductive oxide.

The first and second conductive oxides may be an indium-tin oxide or a ruthenium oxide.

The first and second conductive oxides may be the same material.

The multilayer ceramic electronic component may further include conductive layers formed on the external electrodes.

The conductive layers may include a conductive metal and an organic polymer.

The conductive metal may be any one selected from the group consisting of gold, silver, copper, nickel, and an alloy thereof, the organic polymer may be an epoxy resin, and the conductive layers may be a silver-epoxy resin layer.

The multilayer ceramic electronic component may further include plating layers formed on the conductive layers.

The plating layers may be a nickel plating layer or a tin plating layer.

According to another aspect of the present invention, there is provided a method of manufacturing a multilayer ceramic electronic component, the method including: forming internal electrodes on ceramic green sheets using a first paste including a first conductive oxide; producing a green chip by layering and cutting the ceramic green sheets; producing a fired chip by firing the green chip; and forming external electrodes on outer surfaces of the fired chip using a second paste including a second conductive oxide.

The first paste may have a viscosity lower than that of the second paste.

The internal electrodes and the external electrodes may be formed by different methods.

The internal electrodes may be formed by a printing method, and the external electrodes may be formed by a dipping method.

The firing of the green chip may be performed in the air.

The first and second conductive oxides may be an indium-tin oxide or a ruthenium oxide.

The first and second conductive oxides may be the same material.

The method may further include forming conductive layers on the external electrodes.

The conductive layers may further include a conductive metal and an organic polymer.

The conductive metal may be any one selected from the group consisting of gold, silver, copper, nickel, and an alloy thereof, the organic polymer may be an epoxy resin, and the conductive layers may be a silver-epoxy resin layer.

The method may further include forming plating layers on the conductive layers.

The plating layers may be a nickel plating layer or a tin plating layer.

According to another aspect of the present invention, there is provided a method of manufacturing a multilayer ceramic electronic component, the method including: forming internal electrodes on ceramic green sheets using a first paste including a first conductive oxide; producing a green chip by layering and cutting the ceramic green sheets; forming external electrodes on outer surfaces of the green chip using a second paste including a second conductive oxide; and firing the green chip.

The first paste may have a viscosity lower than that of the second paste.

The internal electrodes and the external electrodes may be formed by different methods.

The internal electrodes may be formed by a printing method, and the external electrodes may be formed by a dipping method.

The firing of the green chip may be performed in the air.

The first and second conductive oxides may be an indium-tin oxide or a ruthenium oxide.

The first and second conductive oxides may be the same material.

The method may further include forming conductive layers on the external electrodes.

The conductive layers may further include a conductive metal and an organic polymer.

The conductive metal may be any one selected from the group consisting of gold, silver, copper, nickel, and an alloy thereof, the organic polymer may be an epoxy resin, and the conductive layers may be a silver-epoxy resin layer.

The method may further include forming plating layers on the conductive layers.

The plating layers may be a nickel plating layer or a tin plating layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
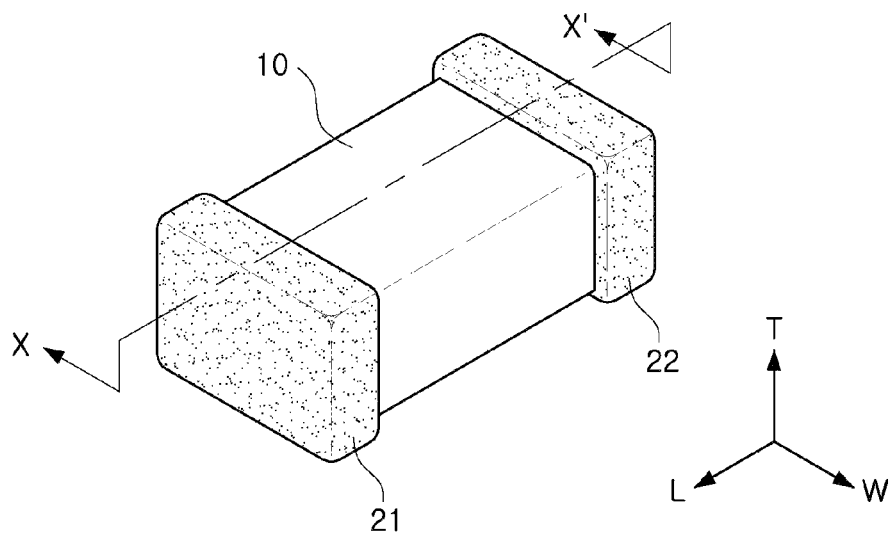
FIG. 1 is a perspective view of a multilayer ceramic electronic component according to an embodiment of the present invention.
Figure 2:
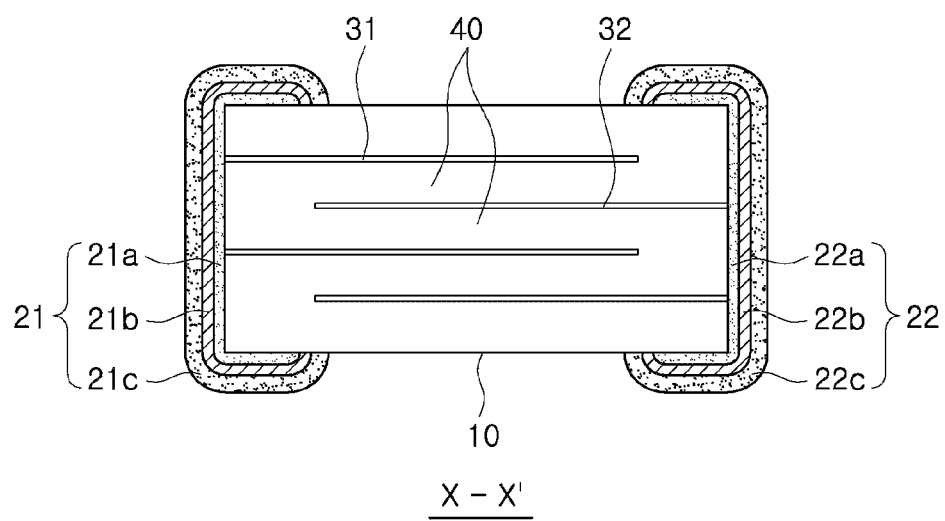
FIG. 2 is a cross-sectional view taken along line X-X' of FIG. 1.

Embodiments of the present invention will now be described in detail with reference to the accompanying drawings. The embodiments of the present invention may be modified in many different forms and the scope of the invention should not be limited to the embodiments set forth herein.

Rather, these embodiments are provided so that this disclosure will be thorough and complete, and will fully convey the concept of the invention to those skilled in the art.

In the drawings, the shapes and dimensions of components may be exaggerated for clarity, and the same reference numerals will be used throughout to designate the same or like components.

FIG. 1 is a perspective view of a multilayer ceramic electronic component according to an embodiment of the present invention. The multilayer ceramic electronic component according to the present embodiment may include a ceramic body 10, external electrodes 21a and 22b, and internal electrodes 31 and 32.

An example of the multilayer ceramic electronic component may include a multilayer ceramic capacitor, a chip inductor, a chip bead, and the like. Although the present invention will be described in detail with respect to a multilayer ceramic capacitor by way of example, the present invention is not limited thereto.

The ceramic body 10 may have a rectangular parallelepiped shape. A 'length direction' refers to a direction in which the external electrodes 21a and 22b are connected to each other, a 'layering direction' or a 'thickness direction' refers to a direction in which the internal electrodes 31 and 32 are multilayered, and a 'width direction' refers to a direction perpendicular to the length direction and the multilayer direction.

Generally, the length of the ceramic body 10 may be greater than the width and the thickness thereof which may be equal.

The ceramic body 10 may be formed of a ceramic material having high permittivity, for example, a barium titanate (BaTiO$_3$)-based material, a lead complex perovskite-based material, a strontium titanate (SrTiO$_3$)-based material, or the like, but is not limited thereto.

The ceramic body 10 is formed by layering a plurality of ceramic dielectric layers 40 and sintering the same, and adjacent dielectric layers 40 may be integrated, such that a boundary therebetween may not be readily apparent.

The internal electrodes 31 and 32 may have one ends thereof exposed to one and other surfaces of the ceramic body 10. In the case in which one end of any internal electrode 31 is exposed to one surface of the ceramic body 10, one end of the internal electrode 32 adjacent thereto may be exposed to the other surface of the ceramic body 10.

The internal electrodes 31 and 32 may be generally formed by printing a paste including a conductive metal, a binder, and a solvent on a dielectric green sheet and then firing the paste.

The internal electrodes 31 and 32 according to the present embodiment may include a conductive oxide instead of a conductive metal. Hereinafter, the conductive oxide forming the internal electrodes 31 and 32 may be referred to as a 'first conductive oxide'.

The conductive oxide is used as the material of the internal electrodes 31 and 32, because in the case in which a base metal such as nickel, or the like, is used as the material of the internal electrodes 31 and 32, nickel may be oxidized during a firing process, such that the electrical conductivity of the internal electrodes 31 and 32 may be reduced.

In order to solve this problem, an atmosphere during the firing process should be maintained as a reducing atmosphere, causing an additional burden. However, when the conductive oxide is used as the material of the internal electrodes 31 and 32, the firing atmosphere does not need to be maintained as a reducing atmosphere and a problem is not generated even in the case in which the firing process is performed in the air.

The conductive oxide may have resistivity of $1 \times 10^{-2}$ Ωcm or less at room temperature.

The first conductive oxide may be an indium-tin oxide or a ruthenium oxide. More specifically, the first conductive oxide may be $RuO_2$, $IrO_2$, $ReO_3$, $SrVO_3$, $SrRuO_3$, $SrMoO_3$, $CaRuO_3$, $BaRuO_3$, $PbRuO_3$, $BiRuO_3$, $LaTaO_3$, and $BiRu_2O_7$.

The indium-tin oxide (ITO) is a conductive oxide that has been mainly used as a transparent electrode material in a display panel such as a touch screen, or the like.

As the binder, a polymer resin such as polyvinyl butyral, ethylcellulose, or the like, may be used. A solvent of the conductive paste for the internal electrodes is not particularly limited but may be, for example, terpineol, dihydroterpineol, butylcarbitol, kerosene, or the like.

The internal electrodes 31 and 32 may be formed on a ceramic green sheet by a screen printing method, a gravure printing method, or the like.

The external electrodes 21a and 22a may be formed on both end surfaces of the ceramic body 10 in a length direction thereof. The external electrodes 21a and 22a may be electrically connected to the internal electrodes 31 and 32 exposed to the respective end surfaces of the ceramic body 10.

The external electrodes 21a and 22b according to the present embodiment may include a conductive oxide. Hereinafter, the conductive oxide forming the external electrodes 21a and 22a maybe referred to as a 'second conductive oxide'.

The external electrodes 21a and 22a may be formed of a conductive paste including a conductive metal and grass frit. In the present embodiment, the conductive metal is replaced with a conductive oxide.

The use of the conductive oxide as the material of the external electrodes 21a and 22a is to stably secure connectivity between the external electrodes 21a and 22a and the internal electrodes 31 and 32 formed of the conductive oxide.

Since metals and ceramics have different internal structures and atomic states, it is not easy to connect them to each other. Further, even in the case in which the metal and the ceramic are connected to each other, since the metal has a thermal expansion coefficient greater than that of the ceramic, when the metal and the ceramic are subjected to repeated thermal history, the metal may be more readily expanded and contracted as compared to the ceramic, a crack may be easily generated on an interface between the metal and the ceramic. Therefore, connectivity between the metal and the ceramic may be deteriorated, which may cause deterioration in the capacitance of a capacitor.

The second conductive oxide maybe an indium-tin oxide or a ruthenium oxide.

The first and second conductive oxides may be formed of the same material.

When the internal electrodes 31 and 32 and the external electrodes 21a and 22a are formed of the same material, adhesion at an interface between the internal electrodes 31 and 32 and the external electrodes 21a and 22a maybe excellent, such that connectivity between the internal electrodes 31 and 32 and the external electrodes 21a and 22a may be more stably secured.

Conductive layers 21b and 22b may be formed on the external electrodes 21a and 22a.

The conductive layers 21b and 22b may have elasticity as well as conductivity. Since the external electrodes 21a and 22a are formed of the conductive oxide, impact resistance may be low. In order to address this, the conductive layers 21b and 22b having elasticity are applied to the external electrodes 21a and 22a to absorb external impacts, thereby protecting the external electrodes 21a and 22a.

The conductive layers 21b and 22b may include a conductive metal and an organic polymer.

The conductive metal may provide conductivity to the conductive layers 21b and 22b, and the organic polymer may provide elasticity to the conductive layers 21b and 22b.

The conductive metal may be any one selected from the group consisting of gold, silver, copper, nickel, and an alloy thereof.

The organic polymer may be an epoxy resin. However, another resin may be used as long as it may provide elasticity to the conductive layers 21b and 22b. In this case, the elasticity of the conductive layers 21b and 22b maybe adjusted by adjusting an amount of a hardener. That is, as the amount of the hardener is reduced, the elasticity of the conductive layers 21b and 22b may be improved.

Plating layers 21c and 22c may be formed on the conductive layers 21b and 22b. The conductive layers 21c and 22c are formed on the multilayer ceramic electronic component, whereby soldering between the external electrodes 21a and 22a and terminals may be easily performed at the time of mounting of the multilayer ceramic electronic component on a substrate.

The plating layers 21c and 22c maybe a nickel plating layer or a tin plating layer.

A manufacturing method for a multilayer ceramic electronic component according to another embodiment of the present invention may include: forming internal electrodes 31 and 32 on ceramic green sheets using a first paste including a first conductive oxide; producing a green chip by layering and cutting the ceramic green sheets; producing the fired chip by firing the green chip; and forming external electrodes 21a and 22a on outer surfaces of the fired chip using a second paste including a second conductive oxide.

The first paste may have a viscosity lower than that of the second paste, and the internal electrodes 31 and 32 and the external electrodes 21a and 22a may be formed by different methods. More specifically, the internal electrodes 21 and 32 maybe formed by a printing method, and the external electrodes 21a and 22a may be formed by a dipping method.

The internal electrodes 31 and 32 may be formed by a screen printing method. On the other hand, the external electrodes 21a and 22a may be formed by a dipping method.

Due to characteristics of a process of forming the internal electrodes 31 and 32 and the external electrodes 21a and 22a (the screen printing method versus the dipping method), the first paste used to form the internal electrodes 31 and 32 may have a viscosity lower than that of the second paste used to form the external electrodes 21a and 22a.

The firing process may be performed in the air.

Since the internal electrodes 31 and 32 are formed of the conductive oxide, the firing process does not need to be maintained under a reducing atmosphere, such that simplified process and reduced manufacturing costs may be achieved.

In addition, at the time of the firing process in the air, additives such as rare earth elements, and the like, added to a dielectric material in order to suppress deterioration in insulation characteristics thereof in the reducing atmosphere may be unnecessary.

The manufacturing method for a multilayer ceramic electronic component may further include forming conductive layers 21b and 22b on the external electrodes 21a and 22a.

In addition, the manufacturing method for a multilayer ceramic electronic component may further include forming plating layers 21c and 22c on the conductive layers 21b and 22b.

Other details regarding the first and second conductive oxides, the conductive layers 21b and 22b, and the plating layers 21c and 22c are the same as details described above.

A manufacturing method for a multilayer ceramic electronic component according to another embodiment of the present invention may include: forming internal electrodes 31 and 32 on ceramic green sheets using a first paste including a first conductive oxide; producing a green chip by layering and cutting the ceramic green sheets; forming external electrodes 21a and 22a on outer surfaces of the green chip using a second paste including a second conductive oxide; and firing the green chip.

In this embodiment, the internal electrodes 31 and 32 and the external electrodes 21a and 22a may be simultaneously fired.

That is, the internal electrodes 31 and 32 and the external electrodes 21a and 22a may be simultaneously fired by forming the external electrodes 21a and 22a on the green chip and then firing the green chip, rather than firing the green chip and then forming the external electrodes 21a and 22b on the fired chip.

Details regarding the viscosities of the first and second pastes, the methods of forming the internal electrodes 31 and 32 and the external electrodes 21a and 22a, the first and second conductive oxides, the conductive layers 21b and 22b, and the plating layers 21c and 22c are the same as details described above.

Inventive Example

A multilayer ceramic capacitor according to Inventive Example was prepared by the following method.

First, barium titanate powders were mixed with additives such as ethanol, binder, and the like, and then ball-milled to prepare a ceramic slurry in which ceramic powders are uniformly dispersed. Then, the ceramic slurry was applied to a carrier film using a doctor blade method and dried to thereby produce a dielectric green sheet having a thickness of 20 μm after sintering.

Next, ITO powders were mixed with additives such as a solvent, a binder, and the like, and then ball-milled to prepare a paste for internal electrodes in which the ITO powders are uniformly dispersed. In addition, a paste for external electrodes having low viscosity was separately prepared by reducing a content of a binder. This is intended to form the external electrodes by a dipping method.

The internal electrodes and the external electrodes were formed of the same material and had different viscosities by adjusting only the content of the binder.

Thereafter, the internal electrodes were formed on the dielectric green sheet using the paste for internal electrodes by a screen printed method, the green sheets were multilayered, and a multilayer body was isostatically pressed at a pressure of 1000 kgf/cm$^2$ at a temperature of 85□ and then cut to prepare a green chip.

The green chip was dipped into the paste for external electrodes and then dried to thereby form the external electrodes on outer surfaces of the green chip.

The green chip having the external electrodes formed thereon was subjected to a de-binder process, in which it is maintained at a temperature of 230□ for 60 hours under an air atmosphere, and a firing process was then performed at a temperature of 1200□ under the air atmosphere to simultaneously fire the internal electrodes and the external electrodes.

Conductive layers were formed on the external electrodes using a silver (Ag)-epoxy conductive paste, and tin plating layers were formed on the conductive layers through electroplating.

Comparative Examples will be mainly described based on differences from Inventive Example.

In Comparative Examples 1 and 2, nickel was used as a main component of internal electrodes, and copper was used as a main component of external electrodes.

In the case of the Comparative Examples, a green chip was fired to prepare a fired chip and the external electrodes were formed on outer surfaces of the fired chip.

In the case of Comparative Example 1, the firing process was performed at a temperature of 900□ under a reducing atmosphere ($10^{-11}$ to $10^{-10}$ atm lower than Ni/NiO equilibrium oxygen partial pressure), and in the case of Comparative Example 2, the firing process was performed at the same temperature as that in Comparative Example 1 under an air atmosphere.

A multilayer ceramic capacitor was designed to have capacitance of 10 μF.

With respect to the multilayer ceramic capacitors prepared using the above-mentioned method, the resistivity of the internal electrodes and the capacitance of each capacitor were measured and compared with each other to be shown in Table 1.

In each of the Comparative Examples and the Inventive Example, average values measured with respect to 50 samples are shown.

TABLE 1

| Division | Internal electrode | Firing Atmosphere | Resistivity of Internal Electrode (Ωcm) | Capacitance of Capacitor (μF) |
|---|---|---|---|---|
| Comparative Example 1 | Nickel | Reducing Atmosphere | $1.24 \times 10^8$ | 10.5 |
| Comparative Example 2 | | Air | $5.4 \times 10^{11}$ | 0.01 |
| Inventive Example | ITO | Air | $1.52 \times 10^8$ | 10.1 |

Referring to Table 1, in Comparative Example 1 in which nickel was used as the material of the internal electrodes and the firing process was performed under the reducing atmosphere, the resistivity of the internal electrode was $1.24 \times 10^8$ Ωcm and the capacitance of the capacitor was 10.5 μF.

On the other hand, in Comparative Example 2 in which nickel was used as the material of the internal electrodes and the firing process was performed in the air, the resistivity of the internal electrode was $5.4 \times 10^{11}$ Ωcm and the capacitance of the capacitor was 0.01 μF. In the case of Comparative Example 2, only a very small amount of capacitance was formed.

It was measured that Comparative Example 2 has a resistivity value greater than that of Comparative Example 1 by about $10^3$. This is because the firing process was performed in the air, such that nickel used as the material of the internal electrode was oxidized. In addition, it could be appreciated that the very small amount of capacitance was formed due to the above-mentioned reason.

In the Inventive Example in which ITO, which is a conductive oxide, was used as the material of the internal electrodes and the firing process was performed in the air, the resistivity of the internal electrode was $5.2 \times 10^8$ Ωcm and the capacitance of the capacitor was 10.1 μF.

In the case of the Inventive Example, although the firing process was performed in the air, there was no significant difference in the resistivity of the internal electrode or the capacitance of the capacitor as compared with Comparative Example 1. It could be appreciated that since the ITO, the conductive oxide, was used as the material of the internal electrode, an increase in resistivity due to the oxidation of the internal electrode did not occur.

It could be appreciated that the resistivity of the Inventive Example was greater than that of Comparative Example 1, because the conductive oxide itself has conductivity lower than that of the nickel metal.

As set forth above, according to embodiments of the present invention, while a multilayer ceramic electronic component is manufactured, it is not necessary to maintain a reducing atmosphere in a firing operation, such that a manufacturing process may be simplified. In addition, problems such as mismatches that maybe generated between metals and ceramics, the oxidization of internal electrodes, or the like, may be easily solved.

While the present invention has been shown and described in connection with the embodiments, it will be apparent to those skilled in the art that modifications and variations can be made without departing from the spirit and scope of the invention as defined by the appended claims.

What is claimed is:
1. A multilayer ceramic electronic component comprising:
   a ceramic body;
   internal electrodes multilayered within the ceramic body and including a first conductive oxide; and
   external electrodes formed on outer surfaces of the ceramic body, connected to the internal electrodes, and including a second conductive oxide, wherein the first conductive oxide and the second conductive oxide are the same conductive oxide, and wherein the first conductive oxide and the second conductive oxide are an indium-tin oxide.

2. The multilayer ceramic electronic component of claim 1, further comprising conductive layers formed on the external electrodes.

3. The multilayer ceramic electronic component of claim 2, wherein the conductive layers include a conductive metal and an organic polymer.

4. The multilayer ceramic electronic component of claim 3, wherein the conductive metal is any one selected from the group consisting of gold, silver, copper, nickel, and an alloy thereof.

5. The multilayer ceramic electronic component of claim 3, wherein the organic polymer is an epoxy resin.

6. The multilayer ceramic electronic component of claim 2, wherein the conductive layers are a silver-epoxy resin layer.

7. The multilayer ceramic electronic component of claim 2, further comprising plating layers formed on the conductive layers.

8. The multilayer ceramic electronic component of claim 7, wherein the plating layers are a nickel plating layer or a tin plating layer.

* * * * *